United States Patent [19]
Strifler et al.

[11] Patent Number: 4,935,377
[45] Date of Patent: Jun. 19, 1990

[54] METHOD OF FABRICATING MICROWAVE FET HAVING GATE WITH SUBMICRON LENGTH

[75] Inventors: Walter A. Strifler, Cupertino; Brad D. Cantos, San Francisco, both of Calif.

[73] Assignee: Watkins Johnson Company, Palo Alto, Calif.

[21] Appl. No.: 388,627

[22] Filed: Aug. 1, 1989

[51] Int. Cl.$^5$ .......................................... H01L 21/265
[52] U.S. Cl. ...................... 437/41; 437/176; 437/229; 437/245; 437/912; 148/DIG. 143; 430/312
[58] Field of Search ............... 148/DIG. 143; 437/41, 437/228, 912; 430/312

[56] References Cited

U.S. PATENT DOCUMENTS 4,618,510 10/1986 Tan ...................................... 437/912

*Primary Examiner*—Brian E. Hearn
*Assistant Examiner*—Laura Holtzman
*Attorney, Agent, or Firm*—Flehr, Hohbach, Test, Albritton & Herbert

[57] ABSTRACT

Disclosed is a method of forming a uniform length gate electrode and contact for a microwave field-effect transistor where the gate electrode has a length of less than one micron. A photoresist plug is formed on the surface of a first photoresist layer, the plug functioning as a shadow mask in the subsequent deposition of a plasma-etch-resistant material (aluminum) over the surface of the plug and the first photoresist layer. A third photoresist layer is formed over the device structure whereby a contact region can be formed on the surface of the semiconductor sub-strate adjacent to the device region. Subsequently, the third photoresist layer is removed, and the previously shielded photoresist material over the gate electrode location is removed by plasma etch using the metal-covered plug and metal-covered first photoresist layer as a plasma-etch shield. A metal is then deposited in the exposed surface region for the gate electrode and contact, and thereafter the photoresist material is removed leaving the gate electrode and contact on the substrate surface.

5 Claims, 3 Drawing Sheets

METHOD OF FABRICATING MICROWAVE FET HAVING GATE WITH SUBMICRON LENGTH

BACKGROUND OF THE INVENTION

This invention relates generally to semiconductor device fabrication, and more particularly the invention relates to the fabrication of a microwave field-effect transistor (FET) having a gate with submicron length.

The operating frequency of an FET for use in a microwave integrated circuit is dependent on the length of the gate electrode between the source and drain regions of the FET. More particularly, gate lengths of from 0.1 to 0.5 micron are required for device operation at higher microwave frequencies.

Heretofore, to achieve uniform gate lengths in the submicron range, electron beam lithography has been required. E-beam processing is relatively slow and requires expensive equipment. The present invention is directed to a process for uniformly fabricating submicron length gates without the need for electron beam lithography and the costs attendant therewith.

SUMMARY OF THE INVENTION

Accordingly, an object of the present invention is a method of uniformly fabricating submicron gates in microwave FETs without the use of electron beam lithography.

A feature of the invention is the use of multiple photoresist layers in defining a mask pattern for the deposition of a metal plasma-etch mask.

Another feature of the invention is the use of a photoresist plug as a mask when depositing a metal plasma etch mask whereby a gate region is masked from the deposited metal.

Briefly, in accordance with the invention, the uniform thickness of a photoresist layer is utilized in forming a uniform mask for metal deposition. A first layer of photoresist is formed on the surface of a semiconductor body in which a metal gate is to be formed. A second layer of photoresist is formed on the first layer, and the second layer is then selectively removed to form a photoresist pattern or plug adjacent to the location for the field-effect transistor gate. A suitable metal such as aluminum is then deposited at an angle with respect to the surface of the semiconductor body whereby the plug shields the surface where the FET gate is to be formed. The deposited metal will thereafter function as a plasma-etch mask so that the exposed photoresist of the first layer where the gate is to be located can be removed by plasma etch.

In a preferred embodiment, a third photoresist layer is utilized so that an enlarged gate contact can be simultaneously fabricated with the gate electrode fabrication.

The invention and objects and features thereof will be more readily apparent from the following detailed description and appended claims when taken with the drawing.

DETAILED DESCRIPTION OF ILLUSTRATIVE EMBODIMENTS

Figure 1A:
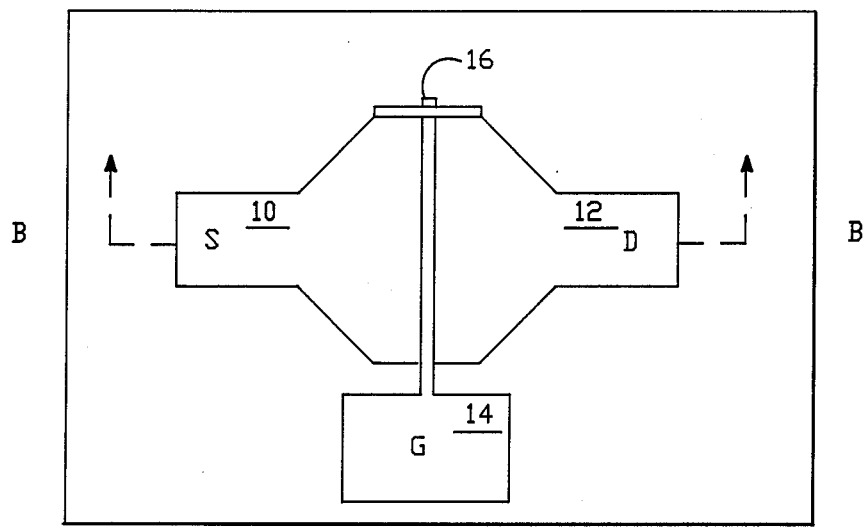
FIG. 1A is a plan view illustrating the configuration of a microwave FET.
Figure 1B:
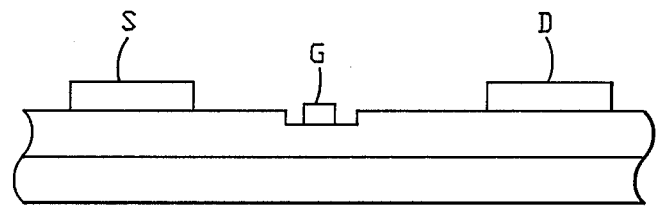
FIG. 1B is a section view taken along the line B—B in FIG. 1A, further illustrating the gate of the FET.

Referring now to the drawing, FIG. 1A is a plan view illustrating the configuration of a microwave FET which is typically fabricated in a III-V compound semiconductor material such as gallium arsenide; and FIG. 1B is a section view along the line B—B. The device includes a source region 10, a drain region 12, and a gate metal contact 14 with a gate electrode 16 extending from the gate contact 14 between the source and drain regions 10, 12. The source and drain are at opposing ends of a first doped region (n-type, for example) overlying a second doped region of opposite conductivity type (p-type or intrinsic, for example). The gate is voltage-biased whereby current flowing from the source region to the drain region is controlled. As noted above, in microwave applications, the gate electrode 16 must be submicron in length (e.g. 0.1–0.5 micron). Further, for optimum electrical characteristics, the gate electrode must be uniform in length.

Heretofore, electron beam lithography has been required in fabricating submicron length gate electrodes with the requisite uniformity in microwave circuit applications. However, electron beam lithography requires expensive equipment and thus increases the cost of fabricating the microwave integrated circuits.

Cantos and Remba have disclosed techniques for fabricating submicron gate FETs without using E-beam technology in "An Improved Technique for ¼ Micrometer Gate Length GaAs MESFET Fabrication by Optical Lithography," *Proceedings of SPIE*, Vol. 773, pp. 61–67, 1987; and in "A Reliable Method for 0.25-Micron Gate MESFET Fabrication Using Optical Photolithography," *Journal of the Electrochemical Society*, Vol. 135, No. 5, pp. 1311–1312, May 1988. The described techniques utilize an image-reversal process with positive photoresist.

It is well known that the thickness of photoresist material as utilized in forming masks in semiconductor device fabrication can be held to plus or minus 200 angstrom thickness variation across a wafer. In accordance with the present invention, the accurate control of photoresist thickness is utilized in fabricating gate electrodes of uniform thickness. For example, uniformity of a gate electrode having a length of 0.1–0.5 micron can be held to ±200 Å since the photoresist thickness can be held to a ±200 Å variation.

Figure 2A:
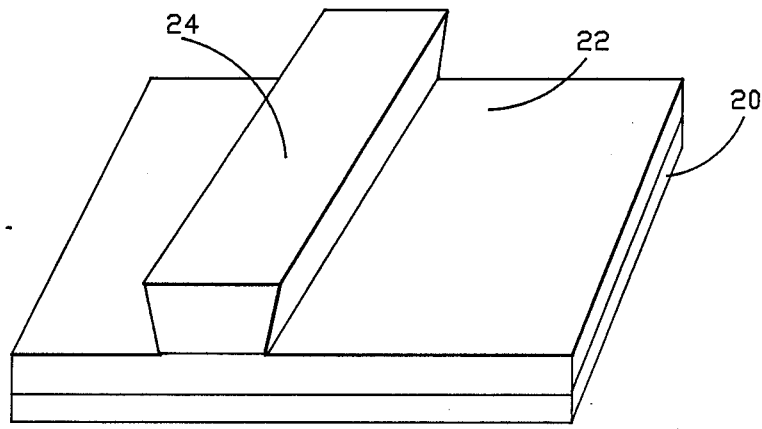
FIGS. 2A–2G are perspective views of a portion of a semiconductor wafer illustrating the steps in fabricating the gate electrode and contact for the microwave FET of FIG. 1 in accordance with the invention.

FIGS. 2A–2G are perspective views of a portion of the device of FIG. 1A illustrating the steps in fabricating the elongated gate electrode 16 and gate contact 14. Initially, the surface of a gallium arsenide substrate 20 is selectively doped to define the FET source and drain structure in the gallium arsenide substrate 20. Thereafter, as illustrated in FIG. 2A, a first photoresist layer 22 is formed over the surface of the gallium arsenide substrate 20 and a second layer of photoresist 24 is then formed over the first photoresist layer 22 and selectively processed to form an elongated pattern or plug 24 adjacent to the location for the elongated gate electrode. Prior to the deposition of the second photoresist layer, the first layer is preferably fluorinated so that the surface of the photoresist layer becomes a fluorinated polymer which displays a low surface energy. This process is disclosed by Dobkin and Cantos in "Plasma Formation of Buffer Layers for Multilayer Resist Structures," *IEEE Electron Device Letters*, Vol. EDL-2, No. 9, September 1981. Consequently, the second photoresist layer can be readily removed from the first layer.

Preferably, the elongated pattern of second photoresist 24 has a retrograde profile so that the top of the pattern 24 is wider than the bottom of the pattern as illustrated. Such a profile can be achieved by image-reversal, a technique whereby a negative-polarity image is formed in a positive photoresist as described to Cantos and Remba, supra.

Figure 2B:
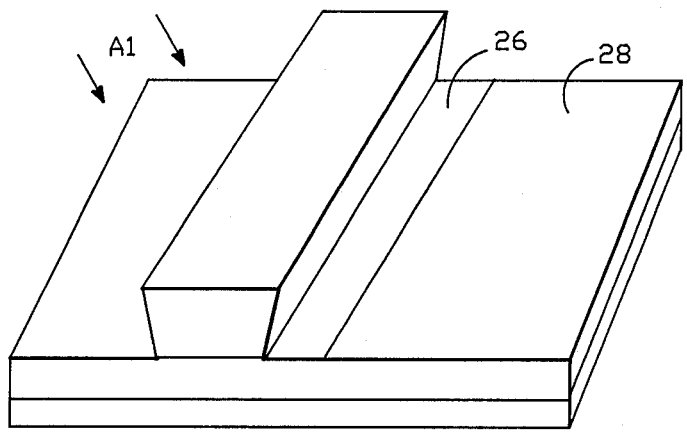

Thereafter, as illustrated in FIG. 2B, aluminum layer 28 is deposited on the surface of the photoresist layer 22 at an angle whereby the photoresist pattern or plug 24 in the second layer functions as a shield and prevents aluminum deposition in the area 26 adjacent to the base of the plug 24 where the gate electrode for the FET is to be located. The width of the shielded region 26 is dependent on the thickness of the plug 24 and the angle of inclination of the substrate surface with respect to the aluminum source.

Figure 2C:
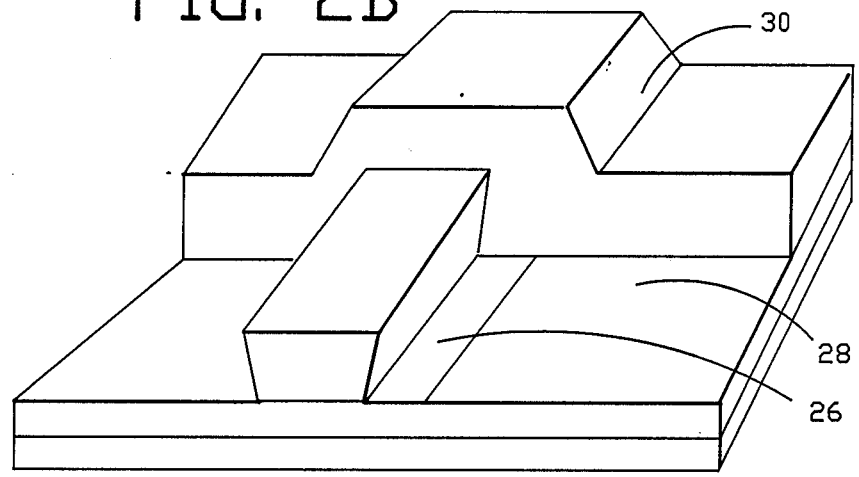

Thereafter, as shown in FIG. 2C, a third layer of photoresist 30 is formed over the first two photoresist layers above the FET structure and is removed from the photoresist layers adjacent to the FET structure. Again, the surface of the first photoresist layer 22 and the second photoresist layer 24 are processed to have a fluorinated polymer layer on the surface thereof whereby the third photoresist layer can eventually be lifted therefrom.

Figure 2D:
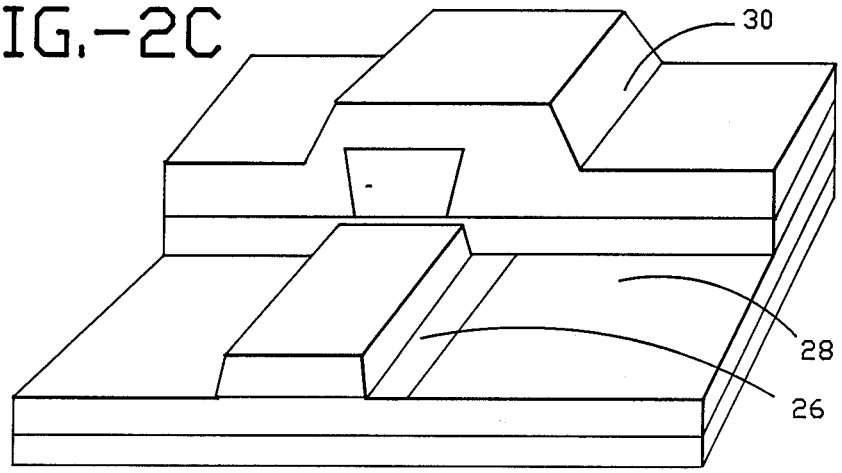

Thereafter, as illustrated in FIG. 2D, the exposed aluminum is removed by a wet etch and the exposed first layer of photoresist material is removed by vertical plasma etch. The plasma etch is terminated before the photoresist layer 30 is completely removed, and consequently a portion of the first photoresist layer remains on the surface of the gallium arsenide substrate where the aluminum material has been removed.

Figure 2E:
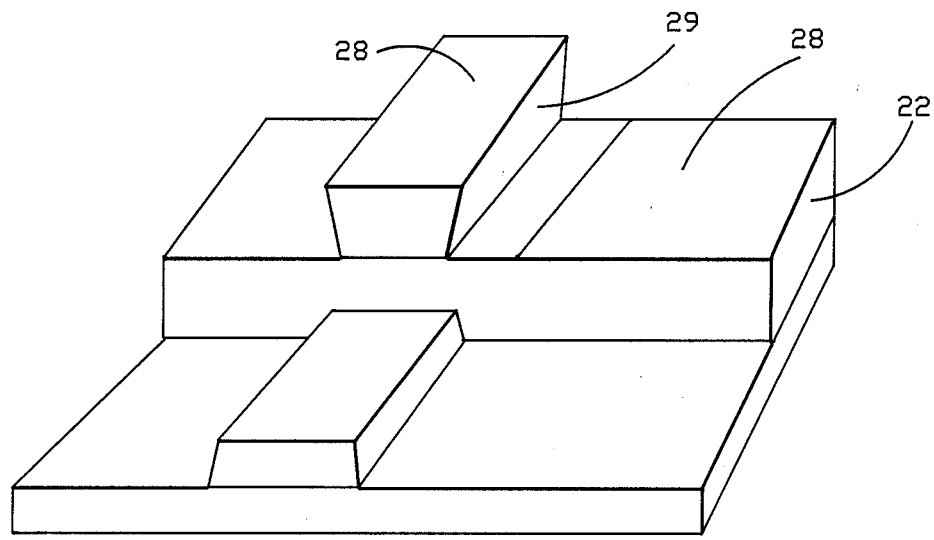
Figure 2F:
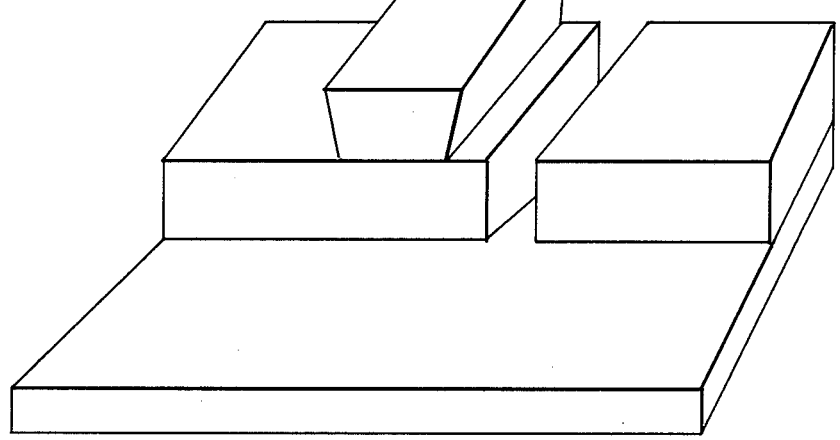

Next, the photoresist layer 30 is exposed and removed by solvent as shown in FIG. 2E, thereby exposing the aluminum layers 28 on the first photoresist layer 22 and the second photoresist layer 24. Using the aluminum layers as a plasma etch, the region 26 of the first photoresist layer 22 is removed by plasma etch (FIG. 2F), thereby exposing the surface of the gallium arsenide substrate where the gate electrode and the gate contact are to be formed. A portion of the gallium arsenide can be removed, also, whereby the gate will be recessed into the substrate.

Figure 2G:
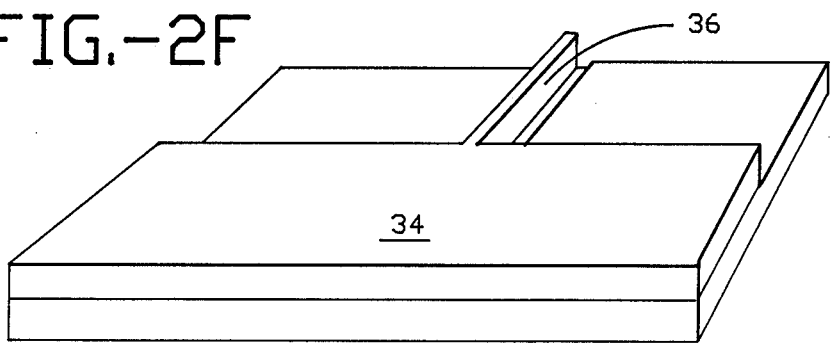

A suitable metal such as aluminum is then deposited on the exposed gallium arsenide surface, and the photoresist layers are then removed, leaving only the gate contact 34 and the gate electrode 36, as shown in FIG. 2G. The gate contact 34 and electrode 36 correspond to the gate contact 14 and the gate electrode 16 of FIG. 1. The device is completed by forming metal source and drain contacts.

The invention has proved to be useful in fabricating uniform length gate electrodes in microwave FETs for use in higher microwave frequencies. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. A method of fabricating a gate electrode and contact for a microwave field-effect transistor comprising the steps of
   (a) providing a semiconductor body having a major surface with a doped region in said major surface defining the source, channel and drain elements of the field-effect transistor,
   (b) forming a first photoresist layer on said major surface over said doped region,
   (c) forming a second photoresist layer on said first photoresist layer, said second photoresist layer comprising an elongated plug over an intermediate portion of said doped region and adjacent to the location for a gate electrode,
   (d) depositing a first metal layer on said first and second photoresist layers at an angle with respect to said major surface, whereby said elongated plug shields said location for a gate electrode,
   (e) forming a third photoresist layer over said doped region and on said first and second photoresist layers,
   (f) patterning said third photoresist layer to expose said metal layer on said first and second photoresist layers adjacent to and spaced from said doped region,
   (g) removing the exposed metal layer, the second photoresist layer underlying said exposed metal layer, and at least a portion of said first photoresist layer underlying said exposed metal layer,
   (i) plasma-etching said first photoresist layer over the location for said gate electrode using the metal-covered plug and the metal-covered first photoresist layer as a plasma shield, said plasma etching also removing any remaining material of said first photoresist layer adjacent to said doped region,
   (j) depositing a second metal layer on said metal-covered plug, said second metal-covered first photoresist layer, and on said location for said gate electrode and said contact, and
   (k) removing said first layer of photoresist and said plug, thereby leaving said gate electrode and contact on said major surface.

2. The method as defined by claim 1 wherein the surface of said first photoresist layer and said photoresist plug are fluorinated to facilitate the separation of said first layer from said second layer and the separation of said third layer from said first and second layers.

3. The method as defined by claim 2 wherein step (c) includes depositing a positive-working photoresist and forming said plug using a negative resist sequence whereby the positive-resist plug is rendered insoluble by exposure and baking in a basic atmosphere.

4. A method of forming a gate electrode and contact for a microwave field-effect transistor comprising the steps of
   (a) providing a semiconductor body having a major surface with a doped region in said major surface defining the source, channel, and drain elements of the field-effect transistor,
   (b) covering said major surface with a first layer of photoresist,
   (c) forming a photoresist plug on said first layer over an intermediate portion of said doped region adjacent to the location for a gate electrode,
   (d) depositing a first metal layer on said first photoresist layer and said plug at an angle with respect to said major surface, whereby said plug shields said location for a gate electrode,
   (e) forming a second photoresist layer over said first metal layer and said first photoresist layer, (f) removing said first photoresist layer from said major surface adjacent to the doped region, thereby defining a contact surface, (g) plasma-etching said first photoresist layer over the location for said gate electrode using the metal-covered plug and the metal-covered first photoresist layer as a plasma shield, (h) depositing a second metal layer on said location for said gate electrode and said contact surface, and (i) removing said first layer of photoresist material and said plug, thereby leaving said gate electrode and contact on said major surface.

5. The method as defined by claim 4 wherein the surface of said first photoresist layer and said photoresist plug have a surface layer of fluorinated polymer, and step (c) includes depositing a positive-working resist and forming said plug using a negative resist sequence wherein the positive-resist plug is rendered insoluble by exposure and baking.

* * * * *